United States Patent
Ito

(10) Patent No.: US 8,587,370 B2
(45) Date of Patent: Nov. 19, 2013

(54) SEMICONDUCTOR DEVICE REDUCING LEAKAGE CURRENT OF TRANSISTOR

(75) Inventor: Teruyuki Ito, Tokyo (JP)

(73) Assignee: Renesas Electronics Corporation, Kawagawa (JP)

( * ) Notice: Subject to any disclaimer, the term of this patent is extended or adjusted under 35 U.S.C. 154(b) by 922 days.

(21) Appl. No.: 12/723,183

(22) Filed: Mar. 12, 2010

(65) Prior Publication Data
US 2010/0164613 A1 Jul. 1, 2010

Related U.S. Application Data

(62) Division of application No. 12/211,220, filed on Sep. 16, 2008, now abandoned.

(30) Foreign Application Priority Data

Oct. 2, 2007 (JP) .................................. 2007-258750

(51) Int. Cl.
*G05F 1/10* (2006.01)

(52) U.S. Cl.
USPC ........................................................ 327/544

(58) Field of Classification Search
USPC ......... 327/108–112, 170, 389, 391, 427, 429,
327/544, 546; 326/22–27, 82, 83;
365/230.06
See application file for complete search history.

(56) References Cited

U.S. PATENT DOCUMENTS

| | | | |
|---|---|---|---|
| 6,380,764 B1 | 4/2002 | Katoh et al. | |
| 6,501,305 B2 * | 12/2002 | Rincon-Mora et al. | ....... 327/108 |
| 6,586,982 B2 | 7/2003 | Furusawa et al. | |
| 6,653,890 B2 | 11/2003 | Ono et al. | |
| 6,831,483 B2 | 12/2004 | Shimazaki et al. | |
| 6,867,637 B2 | 3/2005 | Miyazaki et al. | |
| 7,378,899 B2 | 5/2008 | Hatakeyama et al. | |
| 7,440,320 B2 * | 10/2008 | Lee et al. | ................. 365/185.11 |
| 7,511,558 B2 | 3/2009 | Itoh et al. | |

(Continued)

FOREIGN PATENT DOCUMENTS

| | | |
|---|---|---|
| JP | 11-284493 | 10/1999 |
| JP | 2002-110920 | 4/2002 |
| JP | 2002-111470 | 4/2002 |
| JP | 2002-232268 A | 8/2002 |
| JP | 2004-139718 A | 5/2004 |

OTHER PUBLICATIONS

United States Office Action issued in U.S. Appl. No. 12/211,220, mailed Apr. 13, 2010.

(Continued)

*Primary Examiner* — Lincoln Donovan
*Assistant Examiner* — Sibin Chen
(74) *Attorney, Agent, or Firm* — McDermott Will & Emery LLP

(57) ABSTRACT

A semiconductor device includes: a first transistor having a control electrode coupled to an input node receiving a signal synchronized with a clock, a first conductive electrode coupled to an output node, and a second conductive electrode; a second transistor having a control electrode coupled to the input node, a first conductive electrode coupled to the output node, and a second conductive electrode coupled to a power supply node; and a first switch element connected between the power supply node and the second conductive electrode of the second transistor and turned on and off based on a first control signal indicating a detection result of a frequency of the clock.

4 Claims, 8 Drawing Sheets

(56) References Cited

U.S. PATENT DOCUMENTS

| | | |
|---|---|---|
| 7,532,059 B2 | 5/2009 | Naritake |
| 7,570,089 B2 | 8/2009 | Ronan et al. |
| 7,586,155 B2 | 9/2009 | Kapoor |
| 2004/0076039 A1 | 4/2004 | Chung et al. |
| 2006/0120180 A1 | 6/2006 | Chung et al. |
| 2006/0164153 A1 | 7/2006 | Yamashida |

OTHER PUBLICATIONS

Japanese Notice of Grounds of Rejection, w/ English translation thereof, issued in Japanese Patent Application No. JP 2007-258750 dated Sep. 25, 2012.

* cited by examiner

SEMICONDUCTOR DEVICE REDUCING LEAKAGE CURRENT OF TRANSISTOR

RELATED APPLICATIONS

This application is a Divisional of U.S. application Ser. No. 12/211,220, filed on Sep. 16, 2008 now abandoned, claiming priority of Japanese Patent Application No. 2007-258750, filed on Oct. 2, 2007, the entire contents of each of which are hereby incorporated by reference.

BACKGROUND OF THE INVENTION

1. Field of the Invention

The present invention relates to a semiconductor device, in particular, a semiconductor device that reduces a leakage current of a transistor.

2. Description of the Background Art

Examples of a technique of reducing a leakage current of a transistor may include an MTCMOS (Multi Threshold Voltage Complementary Metal Oxide Semiconductor) circuit that reduces a leakage current in a standby state, and a VTCMOS (Variable Threshold Voltage Complementary Metal Oxide Semiconductor) circuit that reduces a leakage current in an operating state.

As one example of the MTCMOS circuit, for example, Japanese Patent Laying-Open No. 11-284493 discloses the following configuration. That is, in a master-slave flip-flop including a master flip-flop and a slave flip-flop, the master flip-flop is an inverter constituted of a transistor having a low threshold value and connected to a power supply which can be interrupted. Thus, it is possible to suppress power consumption in a standby state and, also, to suppress reduction in operating speed. Moreover, the slave flip-flop is an inverter constituted of a transistor having a relatively higher threshold value so as to drive an output. Thus, a leakage current becomes small in amount. Therefore, the flip-flop can be operated normally even in the standby state. As a result, there is no possibility that stored data is lost.

As another example of the MTCMOS circuit, for example, Japanese Patent Laying-Open No. 2002-110920 discloses the following configuration. That is, two combinational circuits are a logic circuit constituted of a transistor having a low threshold voltage, and a transistor connected between this logic circuit and a power supply line and turned on and off in accordance with a control signal. This control signal makes the two combinational circuits active only when two flip-flop circuits connected to output ends of the two combinational circuits, respectively, capture data in accordance with the control signal. Accordingly, the combinational circuit receives electric power only when outputting data, but receives no electric power in other conditions, leading to reduction in leakage current.

As one example of the VTCMOS circuit, for example, Japanese Patent Laying-Open No. 2002-111470 discloses a configuration that a substrate bias control regulator makes a substrate voltage variable to suppress a leakage current and to achieve low power consumption.

However, the configuration disclosed in each of Japanese Patent Laying-Open Nos. 11-284493 and 2002-110920 is merely one example of the MTCMOS circuit and, therefore, is not intended to reduce a leakage current in an operating state. In the configuration disclosed in Japanese Patent Laying-Open No. 2002-110920, particularly, all transistors included in the logic circuit are operated constantly in an operating state, that is, when outputting data. Consequently, there arises a problem that if the flip-flop circuit is operated at a low speed, a rate of power consumption due to a leakage current with respect to power consumption in the operating state disadvantageously increases.

In addition, each of the configurations disclosed in Japanese Patent Laying-Open Nos. 11-284493, 2002-110920 and 2002-111470 requires an additional power supply line for controlling supply of electric power to a transistor. Consequently, there arises a problem that a semiconductor device disadvantageously increases in area.

SUMMARY OF THE INVENTION

One object of the present invention is to provide a semiconductor device capable of reducing a leakage current of a transistor in an operating state.

Another object of the present invention is to provide a semiconductor device capable of suppressing increase in area due to wiring in a configuration for reducing a leakage current of a transistor.

In summary, a semiconductor device according to one aspect of the present invention includes: a first transistor having a control electrode coupled to an input node, and a conductive electrode coupled to an output node; and a second transistor having a control electrode coupled to the input node, and a conductive electrode coupled to the output node. Herein, a power supply voltage can be controlled whether or not to be supplied to the second transistor or a back gate potential at the second transistor can be changed.

According to the aspect of the present invention, the power supply voltage is controlled whether or not to be supplied to the second transistor or the back gate potential at the second transistor is changed in accordance with an operating speed of the semiconductor device, so that a driving capability of the semiconductor device can be changed.

Thus, it is possible to reduce a leakage current of a transistor in an operating state.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
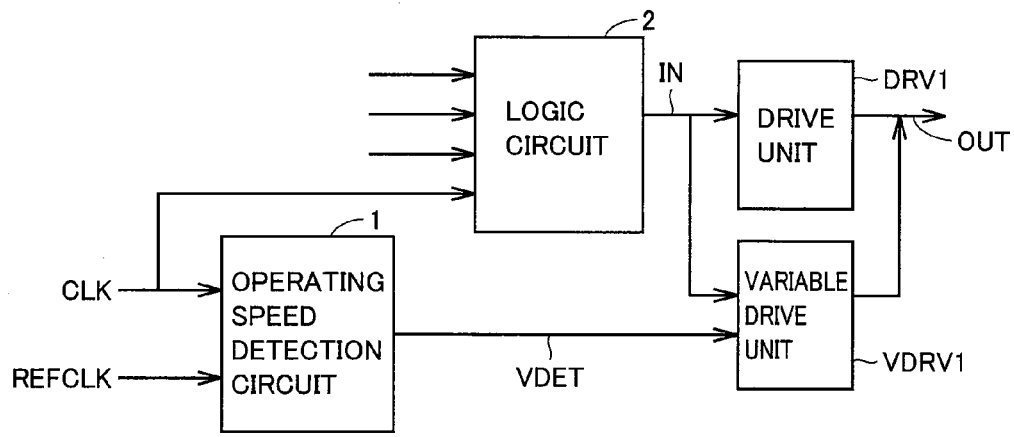
FIG. 1 shows a block diagram of a configuration of a semiconductor device according to a first embodiment of the present invention.

With reference to the drawings, hereinafter, description will be given of one preferred embodiment of the present invention. It is to be noted that identical reference symbols in the drawings denote identical or corresponding components; therefore, detailed description of such components will not be given repeatedly.

First Embodiment

FIG. 1 shows a block diagram of a configuration of a semiconductor device according to a first embodiment of the present invention.

With reference to FIG. 1, semiconductor device 101 includes an operating speed detection circuit 1, a logic circuit 2, a drive unit DRV1 and a variable drive unit VDRV1.

Logic circuit 2 receives an external operating clock CLK, executes signal processing, based on operating clock CLK, and outputs a signal synchronized with operating clock CLK to each of drive unit DRV1 and variable drive unit VDRV1 via an input node IN.

Each of drive unit DRV1 and variable drive unit VDRV1 is a CMOS inverter, for example. That is, each of drive unit DRV1 and variable drive unit VDRV1 receives a signal from logic circuit 2 via input node IN, inverts a logic level of the received signal, and outputs the inverted signal to an output node OUT.

Operating speed detection circuit 1 detects a frequency of operating clock CLK. More specifically, operating speed detection circuit 1 compares operating clock CLK with a reference clock REFCLK, and outputs an operating speed detection signal VDET to variable drive unit VDRV1, based on a result of the comparison.

Variable drive unit VDRV1 receives operating speed detection signal VDET from operating speed detection circuit 1, and determines whether to invert the signal from logic circuit 2 and, then, output the inverted signal, based on operating speed detection signal VDET.

Figure 2:
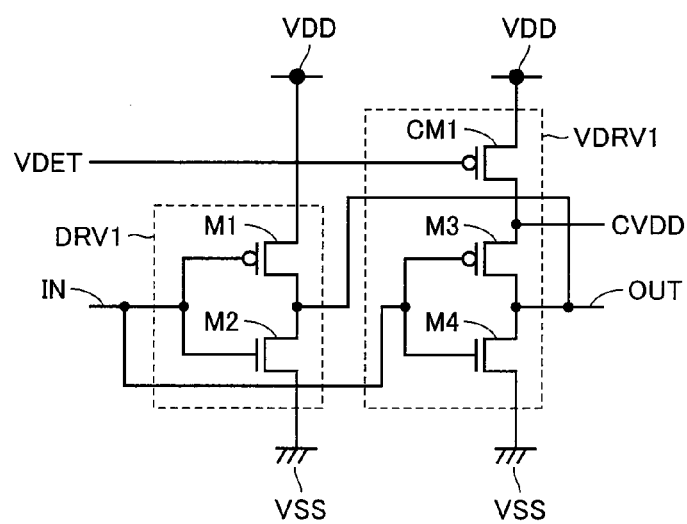
FIG. 2 shows a circuit diagram of a configuration of a drive unit DRV1 and a configuration of a variable drive unit VDRV1 in the semiconductor device according to the first embodiment of the present invention.

FIG. 2 shows a circuit diagram of a configuration of drive unit DRV1 and a configuration of variable drive unit VDRV1 in the semiconductor device according to the first embodiment of the present invention.

With reference to FIG. 2, drive unit DRV1 includes a P-channel MOS transistor M1 and an N-channel MOS transistor M2. Variable drive unit VDRV1 includes a P-channel MOS transistor M3, an N-channel MOS transistor M4 and a control transistor CM1. Control transistor CM1 is a P-channel MOS transistor, for example.

P-channel MOS transistor M1 has a gate coupled to input node IN, a drain coupled to output node OUT, and a source coupled to a power supply node VDD to which a power supply voltage VDD is supplied.

N-channel MOS transistor M2 has a gate coupled to input node IN, a drain coupled to the drain of P-channel MOS transistor M1 and output node OUT, and a source coupled to a ground node VSS to which a ground voltage VSS is supplied.

P-channel MOS transistor M3 has a gate coupled to input node IN, a drain coupled to output node OUT, and a source coupled to a power supply node CVDD to which a power supply voltage VDD is controlled whether or not to be supplied.

Control transistor CM1 has a drain coupled to power supply node CVDD, that is, the source of P-channel MOS transistor M3, a source coupled to a power supply node VDD, and a gate receiving operating speed detection signal VDET.

N-channel MOS transistor M4 has a gate coupled to input node IN, a drain coupled to the drain of P-channel MOS transistor M3 and output node OUT, and a source coupled to a ground node VSS to which a ground voltage VSS is supplied.

Figure 3:
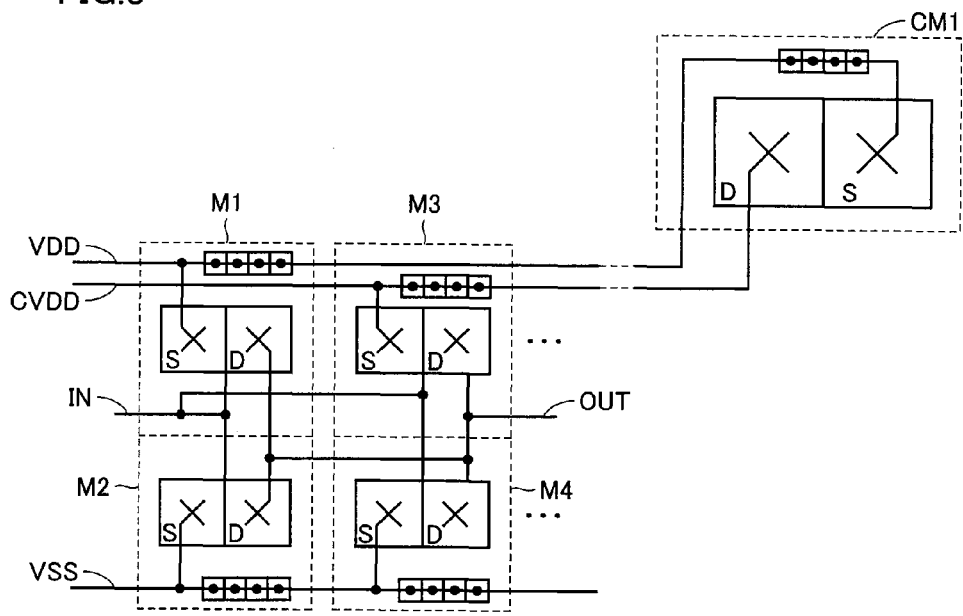
FIG. 3 shows a schematic layout of the semiconductor device according to the first embodiment of the present invention.

FIG. 3 shows a schematic layout of the semiconductor device according to the first embodiment of the present invention.

With reference to FIG. 3, regions M1 to M4 each surrounded with a dotted line represent wells of the transistors. Herein, "S" denotes the source of the transistor and "D" denotes the drain of the transistor. Moreover, the gate of the transistor is formed at a region including a boundary between source S and drain D. Moreover, each region surrounded with the dotted line is different from the other regions in terms of a conduction type of the well or is separated from the wells of the other regions.

P-channel MOS transistor M1 is substantially equal in size to P-channel MOS transistor M3, and N-channel MOS transistor M2 is substantially equal in size to N-channel MOS transistor M4. However, the present invention is not limited to such a configuration. For example, P-channel MOS transistor M1 may be different in size from P-channel MOS transistor M3, and N-channel MOS transistor M2 may be different in size from N-channel MOS transistor M4.

A power supply line VDD, a power supply line CVDD and a ground line VSS are arranged in this order while being spaced away from one another. Power supply line VDD, power supply line CVDD and ground line VSS are arranged in substantially parallel, for example. It is to be noted that the arranging order of power supply line VDD and power supply line CVDD may be reversed.

P-channel MOS transistor M1 and P-channel MOS transistor M3 are arranged side by side in an extending direction of power supply line VDD, power supply line CVDD and ground line VSS. N-channel MOS transistor M2 and N-channel MOS transistor M4 are arranged side by side in the extending direction of power supply line VDD, power supply line CVDD and ground line VSS.

P-channel MOS transistor M1 and N-channel MOS transistor M2 are arranged side by side in an arranging direction of power supply line VDD, power supply line CVDD and ground line VSS. P-channel MOS transistor M3 and N-channel MOS transistor M4 are arranged side by side in the arranging direction of power supply line VDD, power supply line CVDD and ground line VSS.

P-channel MOS transistor M1 has an N-type well connected to power supply line VDD through a contact. N-channel MOS transistor M2 has a P-type well connected to ground line VSS through a contact. P-channel MOS transistor M3 has an N-type well connected to power supply line CVDD through a contact. N-channel MOS transistor M4 has a P-type well connected to ground line VSS through a contact.

The N-type well of P-channel MOS transistor M1 is separated from the N-type well of P-channel MOS transistor M3.

The P-type well of N-channel MOS transistor M2 is separated from the P-type well of N-channel MOS transistor M4.

Moreover, semiconductor device 101 includes a plurality of sets of drive unit DRV1 and variable drive unit VDRV1. That is, FIG. 3 representatively shows only one set including P-channel MOS transistors M1 and M3 as well as N-channel MOS transistors M2 and M4. For example, a plurality of sets described above are arranged side by side in the extending direction of power supply line VDD, power supply line CVDD and ground line VSS. It is to be noted that this embodiment may adopt a configuration that the other set of transistors is arranged as if the set of transistors shown in FIG. 3 is folded back along power supply line VDD or power supply line CVDD or is folded back along ground line VSS. In this case, the plurality of sets of transistors described above are arranged in the arranging direction of power supply line VDD, power supply line CVDD and ground line VSS.

Herein, control transistor CM1 is larger in size than P-channel MOS transistors M1 and M3 as well as N-channel MOS transistors M2 and M4. Hence, power supply voltage VDD can be controlled whether or not to be supplied to the sources of the plurality of P-channel MOS transistors M3 with certainty. In semiconductor device 101, moreover, a wiring layer has allowance in terms of a space, as compared with a substrate region. Therefore, semiconductor device 101 can be reduced in size, as compared with a semiconductor device having a configuration that a plurality of small-sized control transistors CM1 are arranged.

(Operations)

Next, description will be given of operations for switching a driving capability of the semiconductor device according to the first embodiment of the present invention.

In a case where operating clock CLK is high in frequency, that is, in a case where operating clock CLK is higher in frequency than reference clock REFCLK, operating speed detection circuit 1 outputs an operating speed detection signal VDET at a logic low level to the gate of control transistor CM1 in variable drive unit VDRV1.

Control transistor CM1 is turned on by reception of operating speed detection signal VDET at the logic low level. Thus, a power supply voltage VDD is supplied to power supply node CVDD, that is, the source of P-channel MOS transistor M3. Accordingly, the driving capability of semiconductor device 101 corresponds to a sum of a driving capability of drive unit DRV1 and a driving capability of variable drive unit VDRV1, that is, a total size of the respective transistors in drive unit DRV1 and variable drive unit VDRV1. In other words, the driving capability of semiconductor device 101 can be set larger in accordance with a high-speed operation to be performed by semiconductor device 101.

On the other hand, in a case where operating clock CLK is low in frequency, that is, in a case where operating clock CLK is lower in frequency than reference clock REFCLK, a signal outputted from logic circuit 2 becomes lower. In this case, there is required no transistor having a large size so as to satisfy a transition time and a delay time for high-speed switching.

Therefore, operating speed detection circuit 1 outputs an operating speed detection signal VDET at a logic high level to the gate of control transistor CM1 in variable drive unit VDRV1.

Control transistor CM1 is turned off by reception of operating speed detection signal VDET at the logic high level. Thus, no power supply voltage VDD is supplied to power supply node CVDD, that is, the source of P-channel MOS transistor M3. Accordingly, the driving capability of semiconductor device 101 corresponds to the driving capability of drive unit DRV1, that is, a total size of the respective transistors in drive unit DRV1. In other words, the driving capability of semiconductor device 101 can be set smaller in accordance with a low-speed operation to be performed by semiconductor device 101.

In this case, since no power supply voltage VDD is supplied to the source of P-channel MOS transistor M3, a leakage current due to power supply voltage VDD is prevented from being fed through P-channel MOS transistor M3. Therefore, power consumption due to the leakage current can be suppressed.

Conventionally, a configuration disclosed in each of Japanese Patent Laying-Open Nos. 11-284493 and 2002-110920 is merely one example of an MTCMOS circuit and, therefore, is not intended to reduce a leakage current in an operating state. In the configuration disclosed in Japanese Patent Laying-Open No. 2002-110920, moreover, all transistors are operated constantly in the operating state. Consequently, there arises a problem that if the MTCMOS circuit is operated at a low speed, a rate of power consumption due to a leakage current with respect to power consumption in the operating state disadvantageously increases.

In the semiconductor device according to the first embodiment of the present invention, however, the transistor in drive unit DRV1 has the gate coupled to input node IN receiving the signal synchronized with clock CLK, and the drain or source coupled to the output node. P-channel MOS transistor M3 in variable drive unit VDRV1 has the gate coupled to input node IN, the drain coupled to the output node, and the source coupled to power supply node VDD. Then, variable drive unit VDRV1 includes control transistor CM1 connected between power supply node VDD and the source of P-channel MOS transistor M3 and turned on and off based on operating speed detection signal VDET indicating the detection result of the frequency of clock CLK.

With the configuration described above, a power supply voltage can be controlled whether or not to be supplied to the transistor in variable drive unit VDRV1 in accordance with an operating speed of the semiconductor device in an appropriate manner. In the first embodiment of the present invention, accordingly, the semiconductor device can appropriately reduce a leakage current of a transistor in accordance with an operating speed thereof.

It is to be noted that each of drive unit DRV1 and variable drive unit VDRV1 is an inverter in the semiconductor device according to the first embodiment of the present invention; however, the present invention is not limited to this example. For example, each of drive unit DRV1 and variable drive unit VDRV1 may be a buffer. Alternatively, each of drive unit DRV1 and variable drive unit VDRV1 may include only one transistor.

Moreover, the transistor included in each of drive unit DRV1 and variable drive unit VDRV1 is a MOS transistor in the semiconductor device according to the first embodiment of the present invention; however, the present invention is not limited to this example. For example, such a transistor may be a bipolar transistor.

With reference to the drawings, next, description will be given of another preferred embodiment of the present invention. It is to be noted that identical reference symbols in the drawings denote identical or corresponding components; therefore, detailed description of such components will not be given repeatedly.

Second Embodiment

A second embodiment relates to a semiconductor device in which variable drive units are increased in number, as compared with the semiconductor device according to the first embodiment. Details of the semiconductor device according to the second embodiment except details to be described later are similar to those of the semiconductor device according to the first embodiment.

Figure 4:
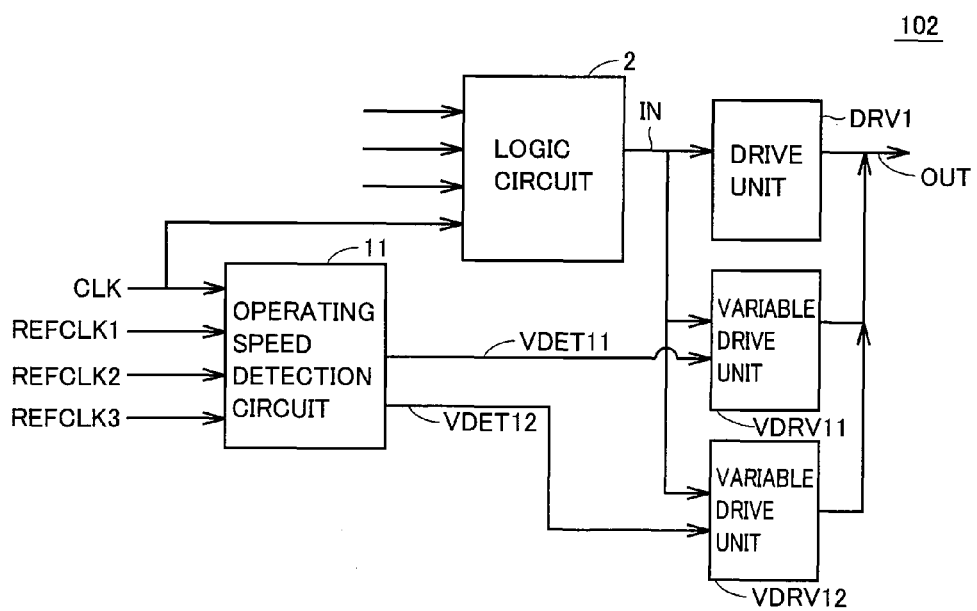
FIG. 4 shows a configuration of a semiconductor device according to a second embodiment of the present invention.

FIG. 4 shows a configuration of the semiconductor device according to the second embodiment of the present invention.

With reference to FIG. 4, semiconductor device 102 includes an operating speed detection circuit 11, a logic circuit 2, a drive unit DRV1, a variable drive unit VDRV11 and a variable drive unit VDRV12.

Each of drive unit DRV1, variable drive unit VDRV11 and variable drive unit VDRV12 is a CMOS inverter, for example. That is, each of drive unit DRV1, variable drive unit VDRV11 and variable drive unit VDRV12 receives a signal from logic circuit 2 via an input node IN, inverts a logic level of the received signal, and outputs the inverted signal to an output node OUT.

Operating speed detection circuit 11 detects a frequency of an operating clock CLK. More specifically, operating speed detection circuit 11 compares operating clock CLK with reference clocks REFCLK1 to REFCLK3, and then outputs operating speed detection signals VDET11 and VDET12 to variable drive units VDRV11 and VDRV12, respectively, based on a result of the comparison.

Variable drive unit VDRV11 receives operating speed detection signal VDET11 from operating speed detection circuit 1 to determine whether to invert the signal from logic circuit 2 and, then, output the inverted signal, based on operating speed detection signal VDET11.

Variable drive unit VDRV12 receives operating speed detection signal VDET12 from operating speed detection circuit 11 to determine whether to invert the signal from logic circuit 2 and, then, output the inverted signal, based on operating speed detection signal VDET12.

Figure 5:
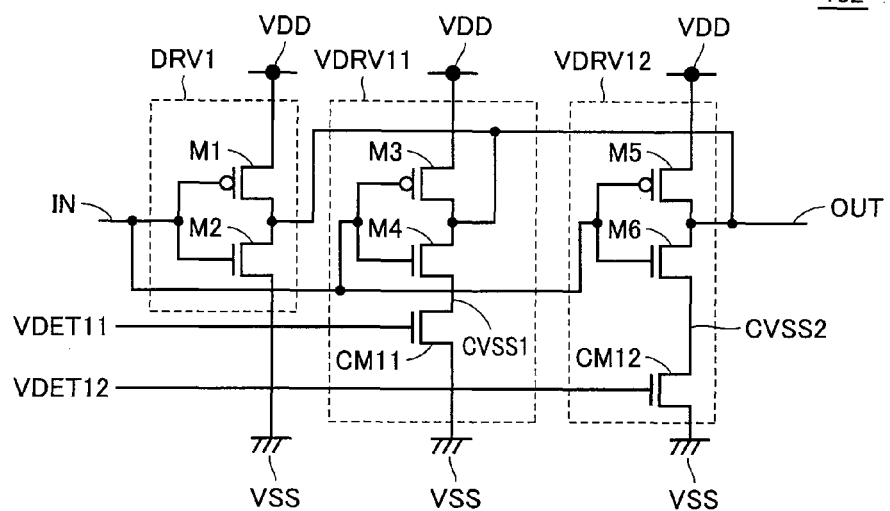
FIG. 5 shows a circuit diagram of a configuration of a drive unit DRV1, a configuration of a variable drive unit VDRV11 and a configuration of a variable drive unit VDRV12 in the semiconductor device according to the second embodiment of the present invention.

FIG. 5 shows a circuit diagram of a configuration of drive unit DRV1, a configuration of variable drive unit VDRV11 and a configuration of variable drive unit VDRV12 in the semiconductor device according to the second embodiment of the present invention.

With reference to FIG. 5, variable drive unit VDRV11 includes a P-channel MOS transistor M3, an N-channel MOS transistor M4 and a control transistor CM11. Control transistor CM11 is an N-channel MOS transistor, for example. Variable drive unit VDRV12 includes a P-channel MOS transistor M5, an N-channel MOS transistor M6 and a control transistor CM12. Control transistor CM12 is an N-channel MOS transistor, for example.

P-channel MOS transistor M3 has a gate coupled to input node IN, a drain coupled to output node OUT, and a source coupled to a power supply node VDD.

N-channel MOS transistor M4 has a gate coupled to input node IN, a drain coupled to the drain of P-channel MOS transistor M3 and output node OUT, and a source coupled to a power supply node CVSS1 to which a ground voltage VSS is controlled whether or not to be supplied.

Control transistor CM11 has a drain coupled to power supply node CVSS1, that is, the source of N-channel MOS transistor M4, a source coupled to a ground node VSS, and a gate receiving operating speed detection signal VDET11.

Moreover, P-channel MOS transistor M5 has a gate coupled to input node IN, a drain coupled to output node OUT, and a source coupled to a power supply node VDD.

N-channel MOS transistor M6 has a gate coupled to input node IN, a drain coupled to the drain of P-channel MOS transistor M5 and output node OUT, and a source coupled to a power supply node CVSS2 to which a ground voltage VSS is controlled whether or not to be supplied.

Control transistor CM12 has a drain coupled to power supply node CVSS2, that is, the source of N-channel MOS transistor M6, a source coupled to a ground node VSS, and a gate receiving operating speed detection signal VDET12.

P-channel MOS transistor M5 and N-channel MOS transistor M6 are larger in size than P-channel MOS transistor M3 and N-channel MOS transistor M4.

(Operations)

Next, description will be given of operations for switching a driving capability of the semiconductor device according to the second embodiment of the present invention. In the following description, it is assumed that reference clock REFCLK1 is higher in frequency than reference clock REFCLK2 and reference clock REFCLK2 is higher in frequency than reference clock REFCLK3.

In a case where the frequency of operating clock CLK is not less than the frequency of reference clock REFCLK1, operating speed detection circuit 11 outputs an operating speed detection signal VDET11 at a logic high level to the gate of control transistor CM11 in variable drive unit VDRV11 and, also, outputs an operating speed detection signal VDET12 at the logic high level to the gate of control transistor CM12 in variable drive unit VDRV12.

Control transistors CM11 and CM12 are turned on by reception of operating speed detection signals VDET11 and VDET12 at the logic high level, respectively. Thus, ground voltage VSS is supplied to each of power supply nodes CVSS11 and CVSS12, that is, each of the sources of N-channel MOS transistors M4 and M6. Accordingly, the driving capability of semiconductor device 102 corresponds to a sum of a driving capability of drive unit DRV1, a driving capability of variable drive unit VDRV11 and a driving capability of variable drive unit VDRV12, that is, a total size of the respective transistors in drive unit DRV1, variable drive unit VDRV11 and variable drive unit VDRV12.

On the other hand, in a case where the frequency of operating clock CLK is less than the frequency of reference clock REFCLK1 and is not less than the frequency of reference clock REFCLK2, operating speed detection circuit 11 outputs an operating speed detection signal VDET11 at a logic low level to the gate of control transistor CM11 in variable drive unit VDRV11. Moreover, operating speed detection circuit 11 outputs operating speed detection signal VDET12 at the logic high level to the gate of control transistor CM12 in variable drive unit VDRV12.

Control transistor CM11 is turned off by reception of operating speed detection signal VDET11 at the logic low level. On the other hand, control transistor CM12 is turned on by reception of operating speed detection signal VDET12 at the logic high level. Thus, ground voltage VSS is supplied to power supply node CVSS12, that is, the source of N-channel MOS transistor M6 while no ground voltage VSS is supplied to power supply node CVSS11, that is, the source of N-channel MOS transistor M4. Accordingly, the driving capability of semiconductor device 102 corresponds to a sum of the driving capability of drive unit DRV1 and the driving capability of variable drive unit VDRV12, that is, a total size of the respective transistors in drive unit DRV1 and variable drive unit VDRV12.

Further, in a case where the frequency of operating clock CLK is less than the frequency of reference clock REFCLK2 and is not less than the frequency of reference clock REFCLK3, operating speed detection circuit 11 outputs operating speed detection signal VDET11 at the logic high level to the gate of control transistor CM11 in variable drive unit VDRV11. Operating speed detection circuit 11 also outputs operating speed detection signal VDET12 at the logic low level to the gate of control transistor CM12 in variable drive unit VDRV12.

Control transistor CM11 is turned on by reception of operating speed detection signal VDET11 at the logic high level. On the other hand, control transistor CM12 is turned off by reception of operating speed detection signal VDET12 at the logic low level. Thus, ground voltage VSS is supplied to power supply node CVSS11, that is, the source of N-channel MOS transistor M4 while no ground voltage VSS is supplied to power supply node CVSS12, that is, the source of N-channel MOS transistor M6. Accordingly, the driving capability of semiconductor device 102 corresponds to a sum of the driving capability of drive unit DRV1 and the driving capability of variable drive unit VDRV11, that is, a total size of the respective transistors in drive unit DRV1 and variable drive unit VDRV11.

Moreover, in a case where the frequency of operating clock CLK is less than the frequency of reference clock REFCLK3, operating speed detection circuit 11 outputs operating speed detection signal VDET11 at the logic low level to the gate of control transistor CM11 in variable drive unit VDRV11 and, also, outputs operating speed detection signal VDET12 at the logic low level to the gate of control transistor CM12 in variable drive unit VDRV12.

Control transistors CM11 and CM12 are turned off by reception of operating speed detection signals VDET11 and VDET12 at the logic low level, respectively. Thus, no ground voltage VSS is supplied to each of power supply nodes CVSS11 and CVSS12, that is, each of the sources of N-channel MOS transistors M4 and M6. Accordingly, the driving capability of semiconductor device 102 corresponds to the driving capability of drive unit DRV1, that is, a total size of the respective transistors in drive unit DRV1.

In the second embodiment, other configurations and operations of the semiconductor device are similar to those of the semiconductor device according to the first embodiment; therefore, detailed description thereof will not be given here repeatedly. In the second embodiment of the present invention, accordingly, since the driving capability of the semiconductor device can appropriately be set in accordance with the operating speed, the semiconductor device can appropriately suppress power consumption due to a leakage current in accordance with an operating speed thereof. Two power supply lines CVSS1 and CVSS2 for control of electric power supply between on and off allow adjustment of the driving capability of semiconductor device 102 at four different levels.

With reference to the drawings, next, description will be given of still another preferred embodiment of the present invention. It is to be noted that identical reference symbols in the drawings denote identical or corresponding components; therefore, detailed description of such components will not be given repeatedly.

Third Embodiment

A third embodiment relates to a semiconductor device in which a configuration for changing a driving capability is changed, as compared with the semiconductor device according to the first embodiment. Details of the semiconductor device according to the third embodiment except details to be described later are similar to those of the semiconductor device according to the first embodiment.

Figure 6:
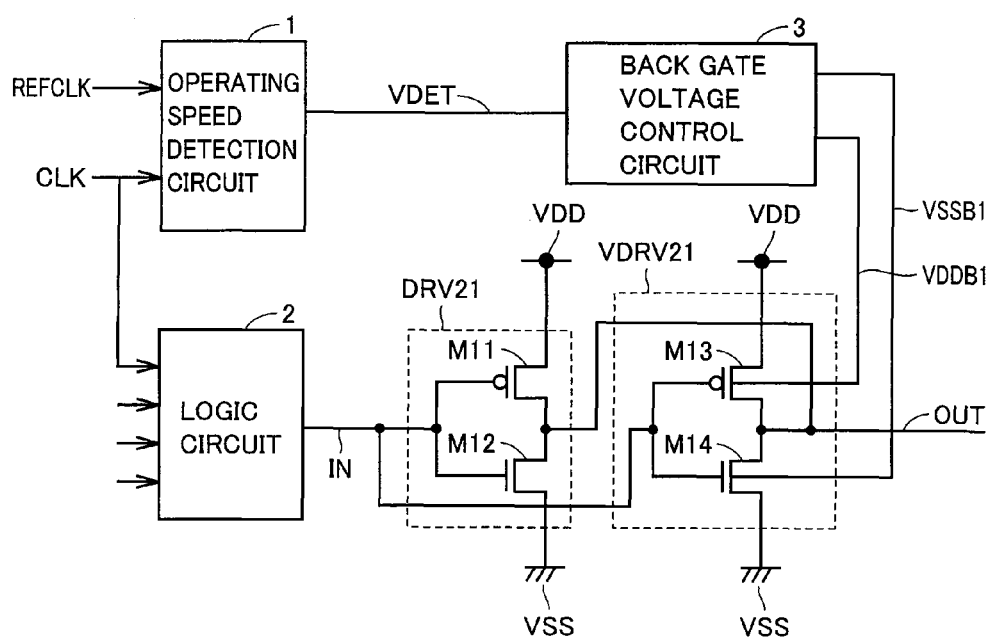
FIG. 6 shows a configuration of a semiconductor device according to a third embodiment of the present invention.

FIG. 6 shows a configuration of the semiconductor device according to the third embodiment of the present invention.

With reference to FIG. 6, semiconductor device 103 includes an operating speed detection circuit 1, a back gate voltage control circuit 3, a logic circuit 2, a drive unit DRV21 and a variable drive unit VDRV21. Drive unit DRV21 includes a P-channel MOS transistor M11 and an N-channel MOS transistor M12. Variable drive unit VDRV21 includes a P-channel MOS transistor M13 and an N-channel MOS transistor M14.

Each of drive unit DRV21 and variable drive unit VDRV21 is a CMOS inverter, for example. That is, each of drive unit DRV21 and variable drive unit VDRV21 receives a signal from logic circuit 2 via an input node IN, inverts a logic level of the received signal, and outputs the inverted signal to an output node OUT.

P-channel MOS transistor M11 has a gate coupled to input node IN, a drain coupled to output node OUT, and a source coupled to a power supply node VDD to which a power supply voltage VDD is supplied.

N-channel MOS transistor M12 has a gate coupled to input node IN, a drain coupled to the drain of P-channel MOS transistor M11 and output node OUT, and a source coupled to a ground node VSS to which a ground voltage VSS is supplied.

P-channel MOS transistor M13 has a gate coupled to input node IN, a drain coupled to output node OUT, a source coupled to a power supply node VDD to which a power supply voltage VDD is supplied, and a back gate to which a back gate voltage VDDB is supplied.

N-channel MOS transistor M14 has a gate coupled to input node IN, a drain coupled to the drain of P-channel MOS transistor M13 and output node OUT, a source coupled to a ground node VSS to which a ground voltage VSS is supplied, and a back gate to which a back gate voltage VSSB is supplied.

Operating speed detection circuit 1 detects a frequency of an operating clock CLK. More specifically, operating speed detection circuit 1 compares operating clock CLK with a reference clock REFCLK, and then outputs an operating speed detection signal VDET to back gate voltage control circuit 3, based on a result of the comparison.

Back gate voltage control circuit 3 receives operating speed detection signal VDET from operating speed detection circuit 1, and then changes back gate voltages VSSB and VDDB, based on operating speed detection signal VDET, to change a threshold value of P-channel MOS transistor M13 and a threshold value of N-channel MOS transistor M14.

Variable drive unit VDRV21 receives back gate voltages VSSB and VDDB from back gate voltage control circuit 3, and then changes the driving capability, based on back gate voltages VSSB and VDDB.

Figure 7:
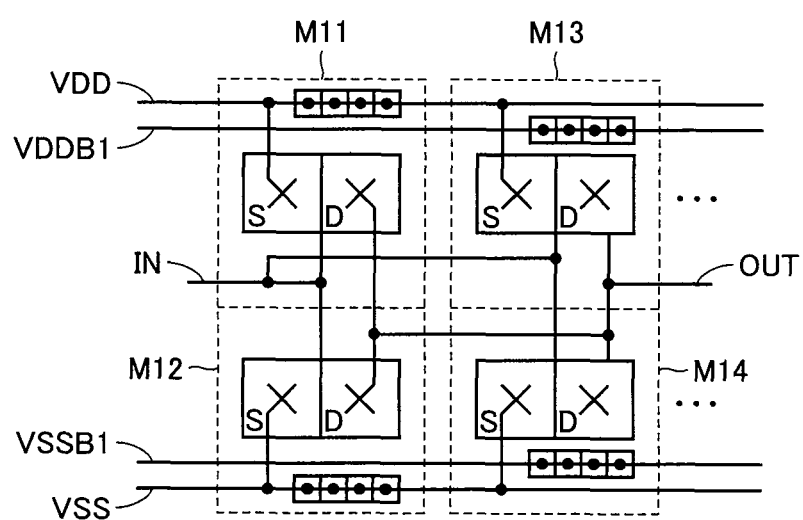
FIG. 7 shows a schematic layout of the semiconductor device according to the third embodiment of the present invention.

FIG. 7 shows a schematic layout of the semiconductor device according to the third embodiment of the present invention.

With reference to FIG. 7, regions M11 to M14 each surrounded with a dotted line represent wells of the transistors. Herein, "S" denotes the source of the transistor and "D" denotes the drain of the transistor. Moreover, the gate of the transistor is formed at a region including a boundary between source S and drain D. Moreover, each region surrounded with the dotted line is different from other regions in terms of a conduction type of the well or is separated from the wells of the other regions.

P-channel MOS transistor Mills substantially equal in size to P-channel MOS transistor M13, and N-channel MOS transistor M12 is substantially equal in size to N-channel MOS transistor M14. However, the present invention is not limited to such a configuration. P-channel MOS transistor M11 may be different in size from P-channel MOS transistor M13, and N-channel MOS transistor M12 may be different in size from N-channel MOS transistor M14.

Power supply line VDD, back gate power supply line VDDB1, back gate power supply line VSSB1 and ground line VSS are arranged in this order while being spaced away from one another. Power supply line VDD, back gate power supply line VDDB1, back gate power supply line VSSB1 and ground line VSS are arranged in substantially parallel, for example. It is to be noted that the arranging order of power supply line VDD and back gate power supply line VDDB1 may be reversed. In addition, the arranging order of ground line VSS and back gate power supply line VSSB1 may be reversed.

P-channel MOS transistor M11 and P-channel MOS transistor M13 are arranged side by side in an extending direction of power supply line VDD, back gate power supply line VDDB1, back gate power supply line VSSB1 and ground line VSS. N-channel MOS transistor M12 and N-channel MOS transistor M14 are arranged side by side in the extending direction of power supply line VDD, back gate power supply line VDDB1, back gate power supply line VSSB1 and ground line VSS.

P-channel MOS transistor M11 and N-channel MOS transistor M12 are arranged side by side in an arranging direction of power supply line VDD, back gate power supply line VDDB1, back gate power supply line VSSB1 and ground line VSS. P-channel MOS transistor M13 and N-channel MOS transistor M14 are arranged side by side in the arranging direction of power supply line VDD, back gate power supply line VDDB1, back gate power supply line VSSB1 and ground line VSS.

P-channel MOS transistor M11 has an N-type well connected to power supply line VDD through a contact. N-channel MOS transistor M12 has a P-type well connected to ground line VSS through a contact. P-channel MOS transistor M13 has an N-type well connected to back gate power supply line VDDB1 through a contact. N-channel MOS transistor M14 has a P-type well connected to back gate power supply line VSSB1 through a contact. Herein, back gate voltage VDDB is supplied from back gate voltage control circuit 3 to back gate power supply line VDDB1. Back gate voltage VSSB is supplied from back gate voltage control circuit 3 to back gate power supply line VSSB1.

The N-type well of P-channel MOS transistor M11 is separated from the N-type well of P-channel MOS transistor M13. The P-type well of N-channel MOS transistor M12 is separated from the P-type well of N-channel MOS transistor M14.

Moreover, semiconductor device 103 includes a plurality of sets of drive unit DRV21 and variable drive unit VDRV21. That is, FIG. 7 representatively shows only one set including P-channel MOS transistors M11 and M13 as well as N-channel MOS transistors M12 and M14. For example, a plurality of sets described above are arranged side by side in the extending direction of power supply line VDD, back gate power supply line VDDB1, back gate power supply line VSSB1 and ground line VSS. It is to be noted that this embodiment may adopt a configuration that the other set of transistors is arranged as if the set of transistors shown in FIG. 7 is folded back along power supply line VDD or back gate power supply line VDDB1 or is folded back along ground line VSS or back gate power supply line VSSB1. In this case, the plurality of sets of transistors described above are arranged in the arranging direction of power supply line VDD, back gate power supply line VDDB1, back gate power supply line VSSB1 and ground line VSS.

(Operations)

Next, description will be given of operations for switching the driving capability of the semiconductor device according to the third embodiment of the present invention.

In a case where operating clock CLK is high in frequency, that is, in a case where operating clock CLK is higher in frequency than reference clock REFCLK, operating speed detection circuit 1 outputs an operating speed detection signal VDET at a logic low level to back gate voltage control circuit 3.

Upon reception of operating speed detection signal VDET at the logic low level, back gate voltage control circuit 3 sets back gate voltage VDDB, which is supplied to the back gate of P-channel MOS transistor M13, to be equal to power supply voltage VDD and, also, sets back gate voltage VSSB, which is supplied to the back gate of N-channel MOS transistor M14, to be equal to ground voltage VSS. In this case, each of P-channel MOS transistor M13 and N-channel MOS transistor M14 is turned on and off in accordance with the logic level of the signal received at the gate thereof. Accordingly, the driving capability of semiconductor device 103 corresponds to a sum of a driving capability of drive unit DRV21 and a driving capability of variable drive unit VDRV21, that is, a total size of the respective transistors in drive unit DRV21 and variable drive unit VDRV21. In other words, the driving capability of semiconductor device 103 can be set larger in accordance with a high-speed operation to be performed by semiconductor device 103.

On the other hand, in a case where operating clock CLK is low in frequency, that is, in a case where operating clock CLK is lower in frequency than reference clock REFCLK, operating speed detection circuit 1 outputs an operating speed detection signal VDET at a logic high level to back gate voltage control circuit 3.

Upon reception of operating speed detection signal VDET at the logic high level, back gate voltage control circuit 3 sets back gate voltage VDDB, which is supplied to the back gate of P-channel MOS transistor M13, to be higher than power supply voltage VDD and, also, sets back gate voltage VSSB, which is supplied to the back gate of N-channel MOS transistor M14, to be lower than ground voltage VSS. With this configuration, each of P-channel MOS transistor M13 and N-channel MOS transistor M14 is turned off irrespective of the logic level of the signal to be received at the gate thereof because an absolute value of a threshold voltage becomes large.

Thus, the driving capability of semiconductor device 103 corresponds to the driving capability of drive unit DRV21, that is, a total size of the respective transistors in drive unit DRV21. In other words, the driving capability of semiconductor device 103 can be set lower in accordance with a low-speed operation to be performed by semiconductor device 103.

In this case, since a leakage current due to power supply voltage VDD is prevented from being fed through P-channel MOS transistor M13 and a leakage current due to ground voltage VSS is prevented from being fed through N-channel MOS transistor M14, power consumption due to the leakage current can be suppressed.

In the third embodiment, other configurations and operations of the semiconductor device are similar to those of the semiconductor device according to the first embodiment; therefore, detailed description thereof will not be given here repeatedly. In the third embodiment of the present invention, accordingly, the semiconductor device can appropriately reduce a leakage current of a transistor in accordance with an operating speed thereof.

With reference to the drawings, next, description will be given of yet another preferred embodiment of the present invention. It is to be noted that identical reference symbols in the drawings denote identical or corresponding components; therefore, detailed description of such components will not be given repeatedly.

Fourth Embodiment

A fourth embodiment relates to a semiconductor device in which a size of a transistor in a variable drive unit is made large, as compared with the semiconductor device according to the first embodiment. Details of the semiconductor device according to the fourth embodiment except details to be described later are similar to those of the semiconductor device according to the first embodiment.

Figure 8:
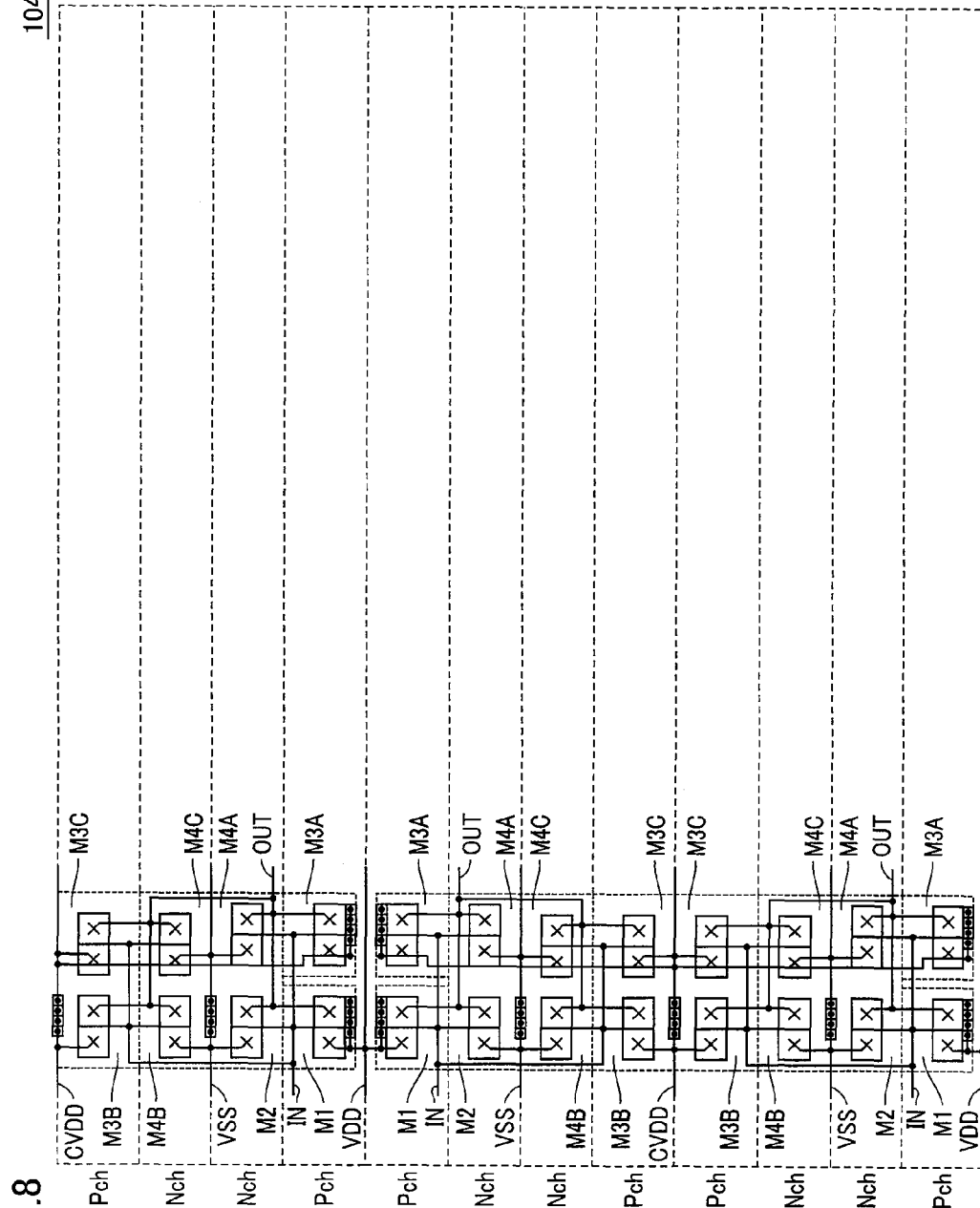
FIG. 8 shows a schematic layout of a semiconductor device according to a fourth embodiment of the present invention.

FIG. 8 shows a schematic layout of the semiconductor device according to the fourth embodiment of the present invention. FIG. 8 is similar to FIG. 3; therefore, detailed description thereabout will not be given here repeatedly.

With reference to FIG. 8, semiconductor device 104 is different from the semiconductor device according to the first embodiment in terms of the following points. That is, P-channel MOS transistors M3A, M3B and M3C are provided in place of P-channel MOS transistor M3, and N-channel MOS transistors M4A, M4B and M4C are provided in place of N-channel MOS transistor M4.

P-channel MOS transistors M3A, M3B and M3C are substantially equal in size to a P-channel MOS transistor M1, and N-channel MOS transistors M4A, M4B and M4C are substantially equal in size to an N-channel MOS transistor M2. That is, a driving capability of a variable drive unit VDRV1 is substantially three times as large as that of a drive unit DRV1 in semiconductor device 104.

A power supply line VDD, a ground line VSS and a power supply line CVDD are arranged in this order while being spaced away from one another. Power supply line VDD, ground line VSS and power supply line CVDD are arranged substantially in parallel, for example.

P-channel MOS transistor M1 and P-channel MOS transistor M3A are arranged side by side in an extending direction of power supply line VDD, ground line VSS and power supply line CVDD.

N-channel MOS transistor M2 and N-channel MOS transistor M4A are arranged side by side between each of P-channel MOS transistor M1 and P-channel MOS transistor M3A and ground line VSS in the extending direction of power supply line VDD, ground line VSS and power supply line CVDD.

P-channel MOS transistor M3B and P-channel MOS transistor M3C are arranged side by side in the extending direction of power supply line VDD, ground line VSS and power supply line CVDD.

N-channel MOS transistor M4B and N-channel MOS transistor M4C are arranged side by side between each of P-channel MOS transistor M3B and P-channel MOS transistor M3C and ground line VSS in the extending direction of power supply line VDD, ground line VSS and power supply line CVDD.

P-channel MOS transistor M1, N-channel MOS transistor M2, N-channel MOS transistor M4B and P-channel MOS transistor M3B are arranged side by side in this order in an arranging direction from power supply line VDD to power supply line CVDD.

P-channel MOS transistor M3A, N-channel MOS transistor M4A, N-channel MOS transistor M4C and P-channel MOS transistor M3C are arranged side by side in this order in the arranging direction from power supply line VDD to power supply line CVDD.

P-channel MOS transistor M1 has an N-type well connected to power supply line VDD through a contact.

N-channel MOS transistors M2, M4A, M4B and M4C have a common P-type well connected to ground line VSS through a contact.

P-channel MOS transistors M3B and M3C have a common N-type well connected to power supply line CVDD through a contact.

P-channel MOS transistor M3A has an N-type well connected to power supply line CVDD through a wire passing above N-channel MOS transistors M4A and M4C and a contact. The configuration described above allows connection between a source and a well of P-channel MOS transistor M3A and power supply line CVDD through use of only the wire in variable drive unit VDRV1.

The N-type well of P-channel MOS transistor M1 is separated from the N-type well of P-channel MOS transistor M3A.

Herein, FIG. 8 representatively shows only one set including P-channel MOS transistors M1, M3A, M3B and M3C as well as N-channel MOS transistors M2, M4A, M4B and M4C. However, a plurality of sets described above may be arranged side by side in the extending direction of power supply line VDD, ground line VSS and power supply line CVDD.

A plurality of drive transistor regions each including power supply line VDD, ground line VSS, power supply line CVDD, P-channel MOS transistors M1, M3A, M3B and M3C and N-channel MOS transistors M2, M4A, M4B and M4C are arranged in the arranging direction of power supply line VDD, ground line VSS and power supply line CVDD. Herein, ground line VSS is shared in these drive transistor regions.

The adjoining drive transistor regions are arranged so as to be symmetrical with respect to power supply line VDD or power supply line CVDD. Further, the adjoining drive transistor regions share power supply line VDD or power supply line CVDD.

Conventionally, each of configurations disclosed in Japanese Patent Laying-Open Nos. 11-284493, 2002-110920 and 2002-111470 requires an additional power supply line for controlling supply of electric power to a transistor. Consequently, there arises a problem that a semiconductor device disadvantageously increases in area.

As shown in the layout of FIG. 8, however, ground line VSS is shared in the drive transistor region in the semiconductor device according to the fourth embodiment of the present invention. Further, the adjoining drive transistor regions share power supply line VDD or power supply line CVDD. In the fourth embodiment of the present invention, accordingly, the semiconductor device can suppress increase in area due to wiring in a configuration for reducing a leakage current of a transistor.

For example, it is also considered a configuration that the respective transistors in drive unit DRV1 and the respective transistors in variable drive unit VDRV1 are arranged side by side in the arranging direction of power supply line VDD, ground line VSS and power supply line CVDD. However, this configuration disadvantageously creates a dead space on a region of drive unit DRV1.

As shown in the layout of FIG. 8, however, the semiconductor device according to the fourth embodiment of the present invention prevents creation of such a dead space, leading to reduction in size of the semiconductor device.

In the fourth embodiment, other configurations and operations of the semiconductor device are similar to those of the semiconductor device according to the first embodiment; therefore, detailed description thereof will not be given here repeatedly. In the fourth embodiment of the present invention, accordingly, the semiconductor device can appropriately reduce a leakage current of a transistor in accordance with an operating speed thereof.

With reference to the drawings, next, description will be given of yet another preferred embodiment of the present invention. It is to be noted that identical reference symbols in the drawings denote identical or corresponding components; therefore, detailed description of such components will not be given repeatedly.

Fifth Embodiment

A fifth embodiment relates to a semiconductor device in which a layout is changed, as compared with the semiconductor device according to the fourth embodiment. Details of the semiconductor device according to the fifth embodiment except details to be described later are similar to those of the semiconductor device according to the fourth embodiment.

Figure 9:
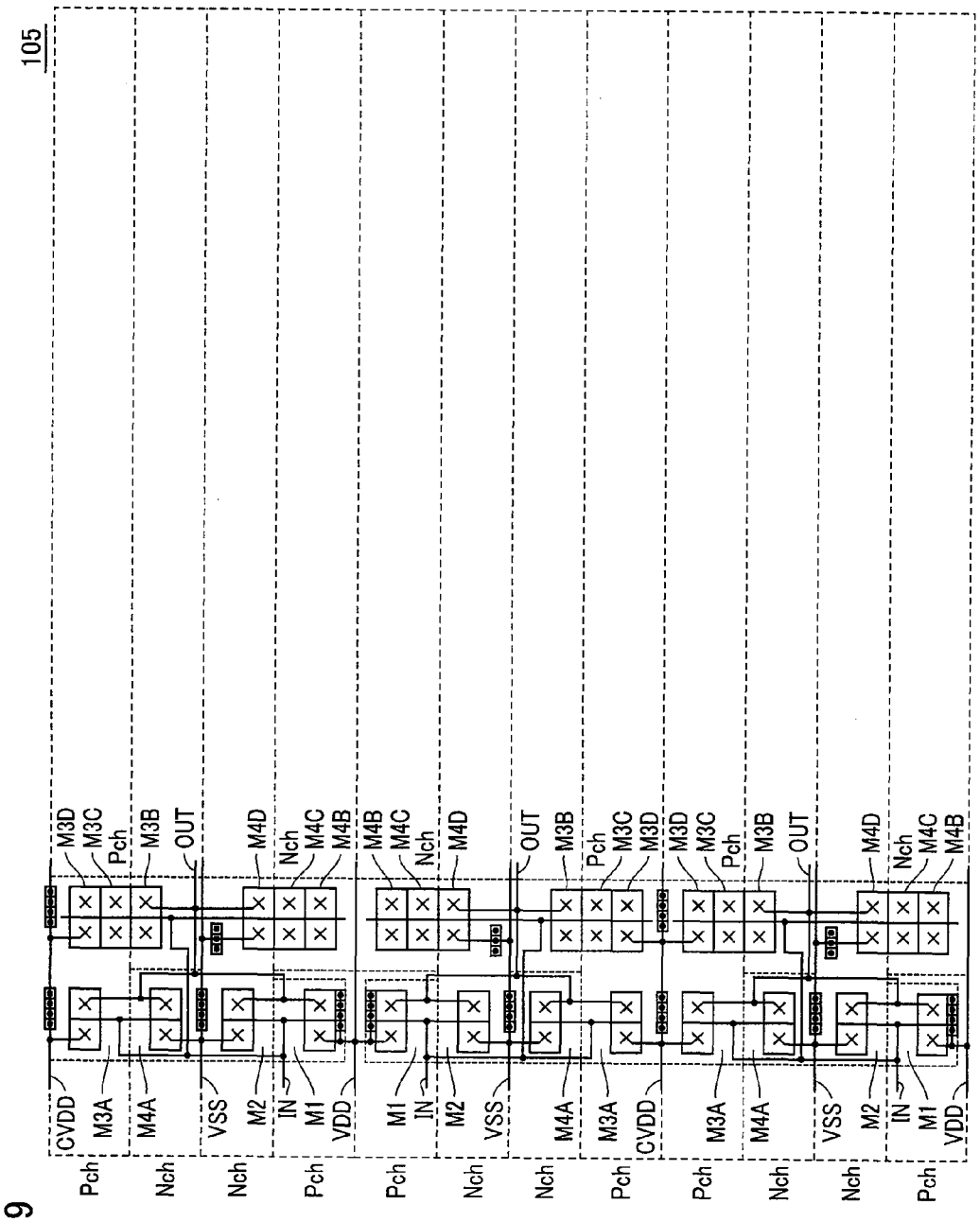
FIG. 9 shows a schematic layout of a semiconductor device according to a fifth embodiment of the present invention.

FIG. 9 shows a schematic layout of the semiconductor device according to the fifth embodiment of the present invention. FIG. 9 is similar to FIG. 3; therefore, detailed description thereabout will not be given here repeatedly.

With reference to FIG. 9, semiconductor device 105 is different from the semiconductor device according to the first embodiment in terms of the following points. That is, P-channel MOS transistors M3A, M3B, M3C and M3D are provided in place of P-channel MOS transistor M3, and N-channel MOS transistors M4A, M4B, M4C and M4D are provided in place of N-channel MOS transistor M4.

P-channel MOS transistors M3A, M3B, M3C and M3D are substantially equal in size to a P-channel MOS transistor M1, and N-channel MOS transistors M4A, M4B, M4C and M4D are substantially equal in size to an N-channel MOS transistor M2. That is, a driving capability of a variable drive unit VDRV1 is substantially four times as large as that of a drive unit DRV1 in semiconductor device 105.

A power supply line VDD, a ground line VSS and a power supply line CVDD are arranged in this order while being spaced away from one another. Power supply line VDD, ground line VSS and power supply line CVDD are arranged substantially in parallel, for example.

P-channel MOS transistor M1 and N-channel MOS transistor M4B are arranged side by side in an extending direction of power supply line VDD, ground line VSS and power supply line CVDD.

N-channel MOS transistor M2 and N-channel MOS transistor M4D are arranged side by side between each of P-channel MOS transistor M1 and N-channel MOS transistor M4B and ground line VSS in the extending direction of power supply line VDD, ground line VSS and power supply line CVDD.

P-channel MOS transistor M3A and P-channel MOS transistor M3D are arranged side by side in the extending direction of power supply line VDD, ground line VSS and power supply line CVDD.

N-channel MOS transistor M4A and P-channel MOS transistor M3B are arranged side by side between each of P-channel MOS transistor M3A and P-channel MOS transistor M3D and ground line VSS in the extending direction of power supply line VDD, ground line VSS and power supply line CVDD.

P-channel MOS transistor M1, N-channel MOS transistor M2, N-channel MOS transistor M4A and P-channel MOS transistor M3A are arranged side by side in this order in an arranging direction from power supply line VDD to power supply line CVDD.

N-channel MOS transistor M4B, N-channel MOS transistor M4C, N-channel MOS transistor M4D, P-channel MOS transistor M3B, P-channel MOS transistor M3C and P-channel MOS transistor M3D are arranged side by side in this order in the arranging direction from power supply line VDD to power supply line CVDD.

P-channel MOS transistor M1 has an N-type well connected to power supply line VDD through a contact.

N-channel MOS transistors M2, M4A, M4B, M4C and M4D have a common P-type well connected to ground line VSS through a contact.

P-channel MOS transistors M3A, M3B, M3C and M3D have a common N-type well connected to power supply line CVDD through a contact.

With the configuration described above, the semiconductor device according to the fifth embodiment of the present invention allows simplification of a wiring structure because there is required no wire passing above N-channel MOS transistors M4A and M4C in order to connect between P-channel MOS transistor M3A and power supply line CVDD in the semiconductor device according to the fourth embodiment of the present invention. Further, the semiconductor device according to the fifth embodiment of the present invention allows prevention of variation in potential between wells, as compared with the semiconductor device according to the fourth embodiment of the present invention, because P-channel MOS transistors M3A, M3B, M3C and M3D have a common N-type well.

Herein, FIG. 9 representatively shows only one set including P-channel MOS transistors M1, M3A, M3B, M3C and M3D as well as N-channel MOS transistors M2, M4A, M4B, M4C and M4D. However, a plurality of sets described above may be arranged side by side in the extending direction of power supply line VDD, ground line VSS and power supply line CVDD.

A plurality of drive transistor regions each including power supply line VDD, ground line VSS, power supply line CVDD, P-channel MOS transistors M1, M3A, M3B, M3C and M3D and N-channel MOS transistors M2, M4A, M4B, M4C and M4D are arranged in the arranging direction of power supply line VDD, ground line VSS and power supply line CVDD. Herein, ground line VSS is shared in these drive transistor regions.

The adjoining drive transistor regions are arranged so as to be symmetrical with respect to power supply line VDD or power supply line CVDD. Further, the adjoining drive transistor regions share power supply line VDD or power supply line CVDD.

In the fifth embodiment, other configurations and operations of the semiconductor device are similar to those of the semiconductor device according to the first embodiment; therefore, detailed description thereof will not be given here repeatedly. In the fifth embodiment of the present invention, accordingly, the semiconductor device can appropriately reduce a leakage current of a transistor in accordance with an operating speed thereof. In the fifth embodiment of the present invention, further, the semiconductor device can suppress increase in area due to wiring in a configuration for reducing a leakage current of a transistor.

With reference to the drawings, next, description will be given of yet another preferred embodiment of the present invention. It is to be noted that identical reference symbols in the drawings denote identical or corresponding components; therefore, detailed description of such components will not be given repeatedly.

Sixth Embodiment

A sixth embodiment relates to a semiconductor device in which a size of a transistor in a variable drive unit is made large, as compared with the semiconductor device according to the third embodiment. Details of the semiconductor device according to the sixth embodiment except details to be described later are similar to those of the semiconductor device according to the third embodiment.

Figure 10:
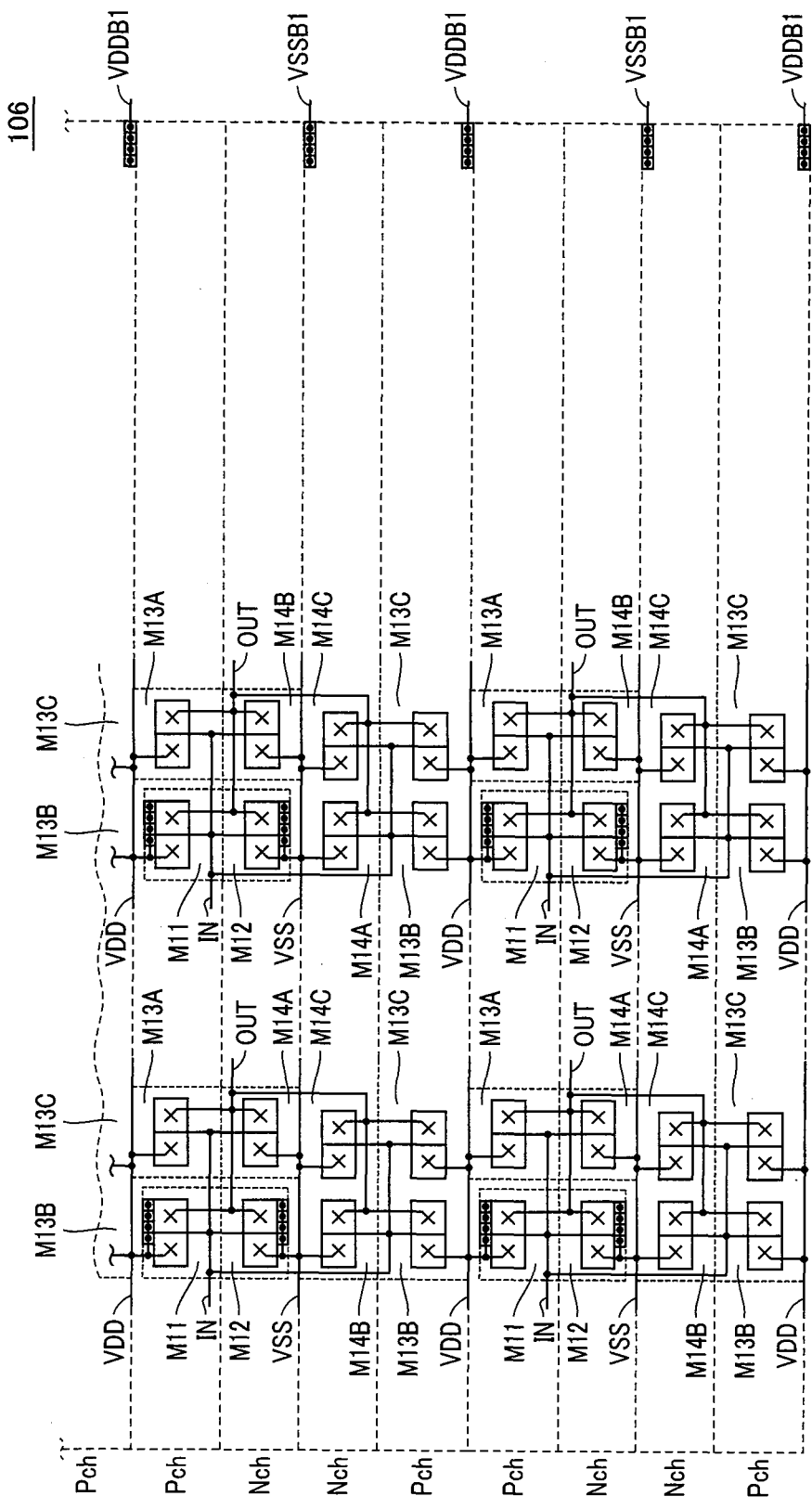
FIG. 10 shows a schematic layout of a semiconductor device according to a sixth embodiment of the present invention.

FIG. 10 shows a schematic layout of the semiconductor device according to the sixth embodiment of the present invention. FIG. 10 is similar to FIG. 7; therefore, detailed description thereabout will not be given here repeatedly.

With reference to FIG. 10, semiconductor device 106 is different from the semiconductor device according to the third embodiment in terms of the following points. That is, P-channel MOS transistors M13A, M13B and M13C are provided in place of P-channel MOS transistor M13, and N-channel MOS transistors M14A, M14B and M14C are provided in place of N-channel MOS transistor M14.

P-channel MOS transistors M13A, M13B and M13C are substantially equal in size to a P-channel MOS transistor M11, and N-channel MOS transistors M14A, M14B and M14C are substantially equal in size to an N-channel MOS transistor M12. That is, a driving capability of a variable drive unit VDRV21 is substantially three times as large as that of a drive unit DRV21 in semiconductor device 106.

A power supply line VDD to which a power supply voltage VDD is supplied and a ground line VSS to which a ground voltage VSS is supplied are arranged while being spaced away from each other. Power supply line VDD and ground line VSS are arranged substantially in parallel, for example.

P-channel MOS transistor M11 and P-channel MOS transistor M13A are arranged side by side in an extending direction of power supply line VDD and ground line VSS.

N-channel MOS transistor M12 and N-channel MOS transistor M14A are arranged side by side between each of P-channel MOS transistor M11 and P-channel MOS transistor M13A and ground line VSS in the extending direction of power supply line VDD and ground line VSS.

P-channel MOS transistor M13B and P-channel MOS transistor M13C are arranged side by side in the extending direction of power supply line VDD and ground line VSS on a side opposite to P-channel MOS transistor M11, P-channel MOS transistor M13A, N-channel MOS transistor M12 and N-channel MOS transistor M14A with respect to ground line VSS.

N-channel MOS transistor M14B and N-channel MOS transistor M14C are arranged side by side between each of P-channel MOS transistor M13B and P-channel MOS transistor M13C and ground line VSS in the extending direction of power supply line VDD and ground line VSS.

P-channel MOS transistor M11, N-channel MOS transistor M12, N-channel MOS transistor M14B and P-channel MOS transistor M13B are arranged side by side in this order in an arranging direction of power supply line VDD and ground line VSS.

P-channel MOS transistor M13A, N-channel MOS transistor M14A, N-channel MOS transistor M14C and P-channel MOS transistor M13C are arranged side by side in this order in the arranging direction of power supply line VDD and ground line VSS.

P-channel MOS transistor M11 has an N-type well connected to power supply line VDD through a contact.

N-channel MOS transistor M12 has a P-type well connected to ground line VSS through a contact.

N-channel MOS transistors M14A, M14B and M14C have a common P-type well connected to a back gate power supply line VSSB1 through a contact.

P-channel MOS transistors M13B and M13C have a common N-type well connected to a back gate power supply line VDDB1 through a contact.

The N-type well of P-channel MOS transistor M11 is separated from the N-type well of P-channel MOS transistor M13A. Moreover, the P-type well of N-channel MOS transistor M12 is separated from the P-type well of N-channel MOS transistors M14A, M14B and M14C.

Herein, FIG. 10 representatively shows only two sets each including P-channel MOS transistors M11, M13A, M13B and M13C as well as N-channel MOS transistors M12, M14A, M14B and M14C in the extending direction of power supply line VDD and ground line VSS. However, at least three sets described above may be arranged side by side in the extending direction of power supply line VDD and ground line VSS. Moreover, the P-type well of N-channel MOS transistors M14A, M14B and M14C is connected to a back gate power supply line VSSB1 and the N-type well of P-channel MOS transistors M13B and M13C is connected to a back gate power supply line VDDB1, respectively, through two contacts provided at two ends of a region where such a plurality of sets are arranged.

A plurality of drive transistor regions each including power supply line VDD, ground line VSS, P-channel MOS transistors M11, M13A, M13B and M13C and N-channel MOS transistors M12, M14A, M14B and M14C are arranged in the arranging direction of power supply line VDD and ground line VSS. Herein, ground line VSS is shared in these drive transistor regions.

The adjoining drive transistor regions share power supply line VDD. In other words, power supply line VDD of one of the adjoining drive transistor regions is identical with power supply line VDD of the other drive transistor region.

Moreover, P-channel MOS transistor M13A in one drive transistor region has an N-type well connected to back gate power supply line VDDB1 through an N-type well of P-channel MOS transistors M13B and M13C in another drive transistor region adjoining to the drive transistor region described above. In other words, P-channel MOS transistor M13A in one of the adjoining drive transistor regions and P-channel MOS transistors M13B and M13C in the other drive transistor region have a common N-type well.

With the configuration described above, the semiconductor device according to the sixth embodiment of the present invention allows simplification of a wiring structure because there is required no wire passing above N-channel MOS transistors M14A and M14C in order to connect between P-channel MOS transistor M13A and back gate power supply line VDDB1. Further, the semiconductor device according to the sixth embodiment of the present invention allows prevention of variation in potential between wells because P-channel MOS transistors M13A, M13B and M13C have a common N-type well.

In the sixth embodiment, other configurations and operations of the semiconductor device are similar to those of the semiconductor device according to the third embodiment; therefore, detailed description thereof will not be given here repeatedly. In the sixth embodiment of the present invention, accordingly, the semiconductor device can appropriately reduce a leakage current of a transistor in accordance with an operating speed thereof. In the sixth embodiment of the present invention, further, the semiconductor device can suppress increase in area due to wiring in a configuration for reducing a leakage current of a transistor.

With reference to the drawings, next, description will be given of yet another preferred embodiment of the present invention. It is to be noted that identical reference symbols in the drawings denote identical or corresponding components; therefore, detailed description of such components will not be given repeatedly.

Seventh Embodiment

A seventh embodiment relates to a semiconductor device in which back gate power supply lines are increased in number, as compared with the semiconductor device according to the sixth embodiment. Details of the semiconductor device according to the seventh embodiment except details to be described later are similar to those of the semiconductor device according to the sixth embodiment.

Figure 11:
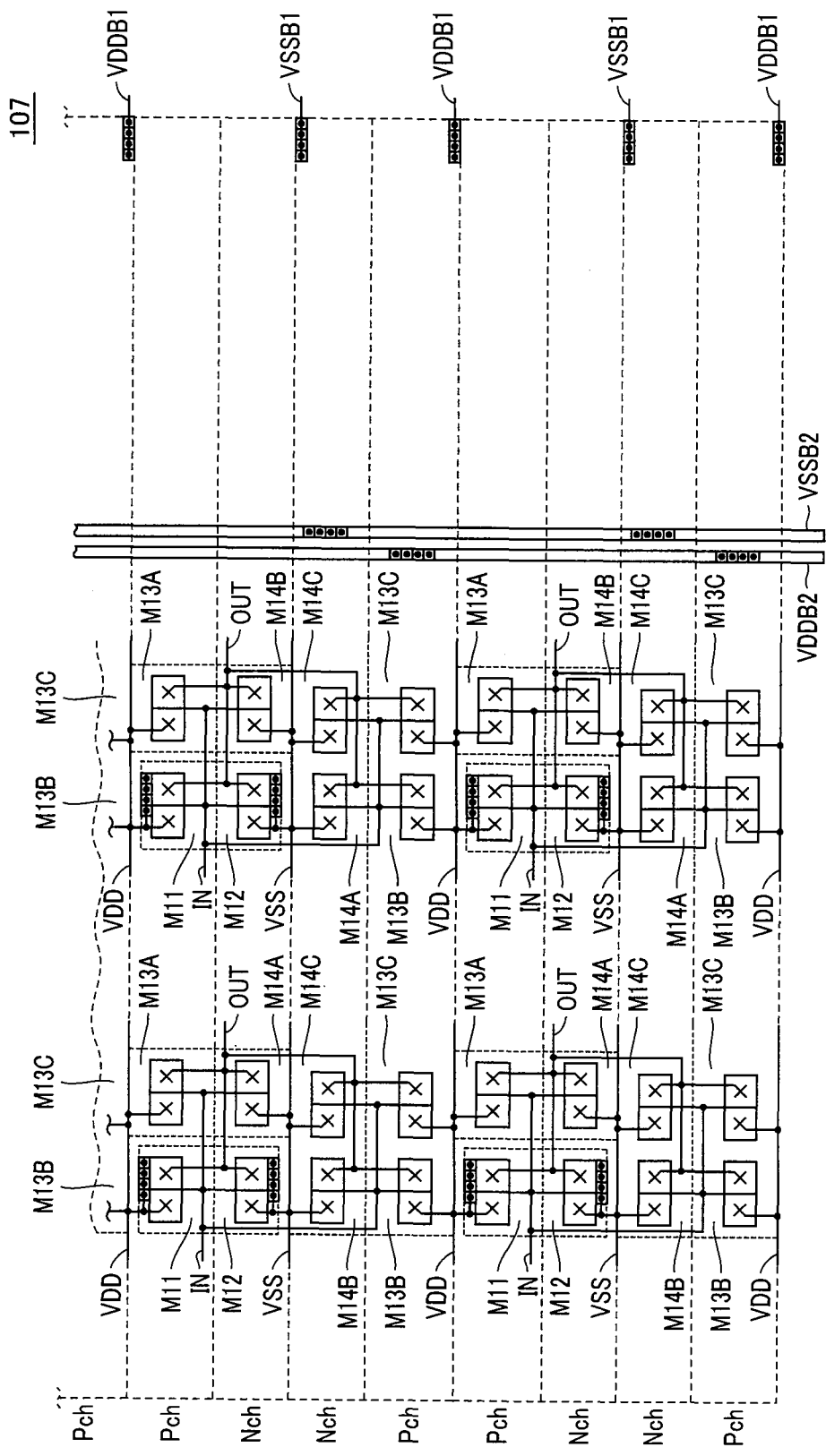
FIG. 11 shows a schematic layout of a semiconductor device according to a seventh embodiment of the present invention.

FIG. 11 shows a schematic layout of the semiconductor device according to the seventh embodiment of the present invention. FIG. 11 is similar to FIG. 10; therefore, detailed description thereabout will not be given here repeatedly.

With reference to FIG. 11, semiconductor device 107 further includes back gate power supply lines VDDB2 and VSSB2, as compared with the semiconductor device according to the sixth embodiment.

A back gate voltage VDDB is supplied from a back gate voltage control circuit 3 to back gate power supply line VDDB2, and a back gate voltage VSSB is supplied from back gate voltage control circuit 3 to back gate power supply line VSSB2.

Back gate power supply line VDDB2 and back gate power supply line VSSB2 are arranged so as to extend in an arranging direction of a power supply line VDD and a ground line VSS. Moreover, back gate power supply line VDDB2 and back gate power supply line VSSB2 are arranged in a second wiring layer formed above a first wiring layer in which power supply line VDD and ground line VSS are arranged.

N-channel MOS transistors M14A, M14B and M14C are connected to back gate power supply line VSSB1 through a contact, and have a common P-type well connected to back gate power supply line VSSB2 through a through hole, a wire in the first wiring layer and a contact.

P-channel MOS transistor M13B and P-channel MOS transistor M13C are connected to back gate power supply line VDDB1 through a contact, and have a common N-type well connected to back gate power supply line VDDB2 through a through hole, a wire in the first wiring layer and a contact.

P-channel MOS transistor M13A in one drive transistor region has an N-type well connected to back gate power supply lines VDDB1 and VDDB2 through an N-type well of P-channel MOS transistors M13B and M13C in another drive transistor region adjoining to the drive transistor region described above.

With this configuration, the semiconductor device according to the seventh embodiment of the present invention allows enhancement in degree of freedom for a count and a layout space of a back gate power supply line, as compared with a semiconductor device having a configuration that new back gate power supply lines are added in an extending direction of a power supply line VDD and a ground line VSS in order to enhance a back gate power supply. In the seventh embodiment of the present invention, therefore, the semiconductor device allows enhancement in back gate power supply and suppression in increase of an area due to wiring.

In the seventh embodiment, other configurations and operations of the semiconductor device are similar to those of the semiconductor device according to the sixth embodiment; therefore, detailed description thereof will not be given here repeatedly. In the seventh embodiment of the present invention, accordingly, the semiconductor device can appropriately reduce a leakage current of a transistor in accordance with an operating speed thereof. In the seventh embodiment of the present invention, further, the semiconductor device can suppress increase in area due to wiring in a configuration for reducing a leakage current of a transistor.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a first transistor having a control electrode coupled to an input node, a first conductive electrode coupled to an output node and a first power supply line, and a second conductive electrode coupled to a second power supply line; and
second to fourth transistors each having a control electrode coupled to said input node, a first conductive electrode coupled to said output node and said first power supply line, a second conductive electrode coupled to said second power supply line, and a well corresponding to a back gate and having a changeable potential,
said second to fourth transistors being substantially equal in size to said first transistor, wherein
said first power supply line and said second power supply line are arranged while being spaced away from each other,
said first transistor and said second transistor are arranged side by side between said first power supply line and said second power supply line in an extending direction of said first power supply line and said second power supply line, and
said third transistor and said fourth transistor are arranged side by side in the extending direction of said first power supply line and said second power supply line on a side opposite to said first transistor and said second transistor with respect to said first power supply line.

2. The semiconductor device according to claim 1, wherein said well of each of said third and fourth transistors is coupled to a back gate power supply line to which a changeable voltage is supplied,
a plurality of regions each including said first and second power supply lines and said first to fourth transistors are arranged in an arranging direction of said first power supply line and said second power supply line,
said well of said second transistor in one of said adjoining regions is coupled to at least any one of said well of said third transistor and said well of said fourth transistor in the other one of said adjoining regions.

3. The semiconductor device according to claim 1, wherein said back gate power supply line is arranged so as to extend in the arranging direction of said first power supply line and said second power supply line.

4. The semiconductor device according to claim 1, wherein each of said first to fourth transistors is of a first conduction type,
said semiconductor device further comprising:
a second conduction type fifth transistor having a control electrode coupled to said input node, said fifth transistor being connected between said first conductive electrode of said first transistor and said first power supply line and being substantially equal in size to said first transistor; and second conduction type sixth to eighth transistors each having a control electrode coupled to said input node, and a well corresponding to a back gate and having a changeable potential, said sixth to eighth transistors being connected between said first conductive electrode of each of said second to fourth transistors and said first power supply line and being substantially equal in size to said first transistor, wherein said fifth transistor and said sixth transistor are arranged side by side between each of said first and second transistors and said first power supply line in the extending direction of said first power supply line and said second power supply line, and said seventh transistor and said eighth transistor are arranged side by side between each of said third and fourth transistors and said first power supply line in the extending direction of said first power supply line and said second power supply line.

* * * * *